United States Patent
Liu et al.

(10) Patent No.: US 11,369,045 B2
(45) Date of Patent: Jun. 21, 2022

(54) CLOSED COLD POOL SYSTEM

(71) Applicant: ZTE Corporation, Shenzhen (CN)

(72) Inventors: Fan Liu, Shenzhen (CN); Hongxuan Tang, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 17/275,907

(22) PCT Filed: Sep. 12, 2019

(86) PCT No.: PCT/CN2019/105658
§ 371 (c)(1),
(2) Date: Mar. 12, 2021

(87) PCT Pub. No.: WO2020/057435
PCT Pub. Date: Mar. 26, 2020

(65) Prior Publication Data
US 2021/0315133 A1    Oct. 7, 2021

(30) Foreign Application Priority Data
Sep. 19, 2018    (CN) .......................... 201811093068.3

(51) Int. Cl.
*H05K 7/14* (2006.01)
*H05K 7/20* (2006.01)

(52) U.S. Cl.
CPC ..... *H05K 7/20754* (2013.01); *H05K 7/20145* (2013.01)

(58) Field of Classification Search
CPC ........... H05K 7/20754; H05K 7/20145; H05K 7/1497; H05K 7/20736; H05K 7/20554;
(Continued)

(56) References Cited

U.S. PATENT DOCUMENTS

2012/0087087 A1*  4/2012  Nicolai ............. H05K 7/20836
                                                      361/679.48

FOREIGN PATENT DOCUMENTS

CN    201113772 Y    9/2008
CN    102348342 A    2/2012
(Continued)

OTHER PUBLICATIONS

International Search Report and Written Opinion, Application No. PCT/CN2019/105658, dated Nov. 8, 2019.

*Primary Examiner* — Mandeep S Buttar
(74) *Attorney, Agent, or Firm* — Vivacqua Crane, PLLC

(57) ABSTRACT

A closed cold pool system is disclosed. The closed cold pool system may include a first closing assembly, a cabinet assembly and a second closing assembly. The first closing assembly is provided on a front side of the cabinet assembly to form a first closed cold aisle, and the second closing assembly is provided on a rear side of the cabinet assembly to form a second closed cold aisle. The cabinet assembly may include a power distribution cabinet, an in-row air conditioner and a main device unit that are provided side by side. The in-row air conditioner may include a front air supply opening, a rear air supply opening and a top air return opening. The front air supply opening is communicated with the first closed cold aisle, and the rear air supply opening is communicated with the second closed cold aisle.

10 Claims, 4 Drawing Sheets

(58) Field of Classification Search
CPC ............ H05K 7/20709; H05K 7/1488; H05K 7/20181; H05K 7/20781; H05K 7/2059; H05K 7/20618; H05K 7/18; H05K 7/1492; F24F 2221/40; F24F 13/08; G06F 1/20; G06F 1/181
USPC ................ 361/679.46, 691, 679.48, 679.02; 165/104.33; 454/184, 239
See application file for complete search history.

(56) References Cited

FOREIGN PATENT DOCUMENTS

| | | |
|---|---|---|
| CN | 107041110 A | 8/2017 |
| DE | 202005002849 U1 | 5/2005 |
| EP | 1307082 A2 | 5/2003 |

* cited by examiner

CLOSED COLD POOL SYSTEM

CROSS-REFERENCE TO RELATED APPLICATIONS

This application is a national stage filing under 35 U.S.C. § 371 of international application number PCT/CN2019/105658, filed Sep. 12, 2019, which claims priority to Chinese patent application No. 201811093068.3, filed Sep. 19, 2018. The contents of these applications are incorporated herein by reference in their entirety.

TECHNICAL FIELD

The present disclosure relates to the technical field of heat dissipation and protection of transmission devices in a communication machine room, and more particularly, to a closed cold pool system.

BACKGROUND

With the increase in the integration level of communication devices, the power consumption of a single cabinet has increased year by year. The overall power consumption of a single cabinet has far exceeded the cooling capacity of a single rack in a machine room, which causes heat dissipation problems such as local hot spots in the machine room near devices with high power consumption density. The heat dissipation problems of the devices in the machine room are especially serious in transmission devices with a complex air duct. Ventilation modes of highly-integrated transmission devices available on the market include front-rear air-inlet and front-rear-top air-outlet, or front-rear air-inlet and top air-outlet. In order to solve the heat dissipation problems of such high-power-consumption transmission devices, there is a need to construct a cold pool environment for the transmission devices in the machine room, but the mixing of inlet and outlet air caused by a complicated air duct form limits the possibility of cold pool construction.

SUMMARY

A closed cold pool system and an interactive method thereof are provided according to some embodiments of the present disclosure.

An embodiment of the present disclosure provides a closed cold pool system, including a first closing assembly, a cabinet assembly and a second closing assembly, where the first closing assembly is provided on a front side of the cabinet assembly, such that a first closed cold aisle is formed on the front side of the cabinet assembly, the second closing assembly is provided on a rear side of the cabinet assembly, such that a second closed cold aisle is formed on the rear side of the cabinet assembly, and the cabinet assembly includes a power distribution cabinet, an in-row air conditioner and a main device unit that are provided side by side; the in-row air conditioner includes a front air supply opening, a rear air supply opening and a top air return opening, where the front air supply opening is communicated with the first closed cold aisle, and the rear air supply opening is communicated with the second closed cold aisle; and the main device unit is of a front-rear air-inlet and top air-outlet structure formed by a plurality of transmission devices and combined air guiding cabinets on two sides thereof.

The closed cold pool system provided by the embodiment of the present disclosure is of a micro-cold pool structure with front and rear sides closed, which is formed by a cabinet containing one or more transmission devices, an in-row air conditioner, air guide cabinets, and closing assemblies on the front and rear sides of devices. An air duct form of the transmission devices is changed to a form of front-rear air-inlet and top air-outlet by the air guide cabinets mounted on the left and right sides of the transmission devices. Meanwhile, cold air is conveyed to the cold aisles on the front and rear sides of the devices by using the in-row air conditioner with a customized conveying form in which air returns from the top and is fed from front and rear sides. After the cold air enters the main device unit, hot air is discharged into the external environment at the top of the micro-cold pool by the devices themselves and the air guide cabinets on both sides. The hot air enters the air return opening of the air conditioner and is cooled by a coil, and is then conveyed to the front and rear cold aisles via the front and rear air supply openings, thereby forming a complete air circulation. It can be seen that this closed cold pool system implements cold pool closing of the transmission devices having complex air ducts, solves the problem of heat dissipation of high-power-consumption transmission devices, and meanwhile achieves the decoupling of the heat dissipation of the transmission devices from the overall environment of the machine room, such that the impact of the high-power-consumption transmission devices on the overall environment of the machine room are minimized, thereby improving the local refrigeration efficiency of the machine room, and reducing the maintenance cost of the machine room.

The example implementation of the objective, functional characteristics and advantages of the present disclosure will be further described in conjunction with the embodiments and with reference to the accompanying drawings.

DETAILED DESCRIPTION

It should be understood that some embodiments described here are only used to explain the present disclosure, but not used to limit the present disclosure.

In the following description, the use of suffixes such as "module", "component" or "unit" used to denote elements is only conducive to the description of the present disclosure, and has no special meaning themselves. Therefore, "module", "component" or "unit" can be used in a mixed manner.

Example Embodiment One

Figure 1:
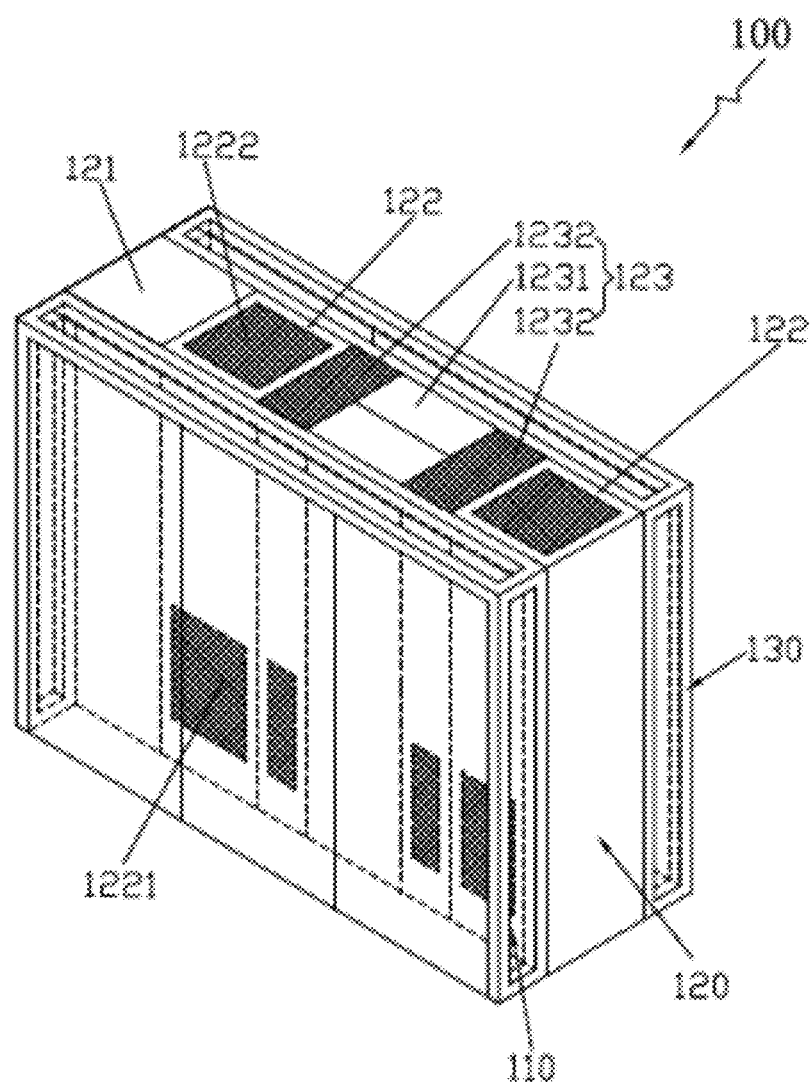
FIG. 1 is a structural diagram of a closed cold pool system provided by Example Embodiment one of the present disclosure.

As shown in FIG. 1, this embodiment provides a closed cold pool system 100. The closed cold pool system 100 includes a first closing assembly 110, a cabinet assembly 120 and a second closing assembly 130. The first closing assembly 110 is provided on the front side of the cabinet assembly 120, such that a first closed cold aisle is formed on the front side of the cabinet assembly 120. The second closing assembly 130 is provided on the rear side of the cabinet assembly 120, such that a second closed cold aisle is formed on the rear side of the cabinet assembly 120. The cabinet assembly 120 includes a power distribution cabinet 121, an in-row air conditioner 122 and a main device unit 123 that are provided side by side. The in-row air conditioner 122 includes a front air supply opening 1221, a rear air supply opening (not shown) and a top air return opening 1222. The front air supply opening 1221 is communicated with the first closed cold aisle, and the rear air supply opening is communicated with the second closed cold aisle. The main device unit 123 is of a front-rear air-inlet and top air-outlet structure formed by a plurality of transmission devices 1231 and a plurality of combined air guiding cabinets on two sides thereof.

Figure 2:
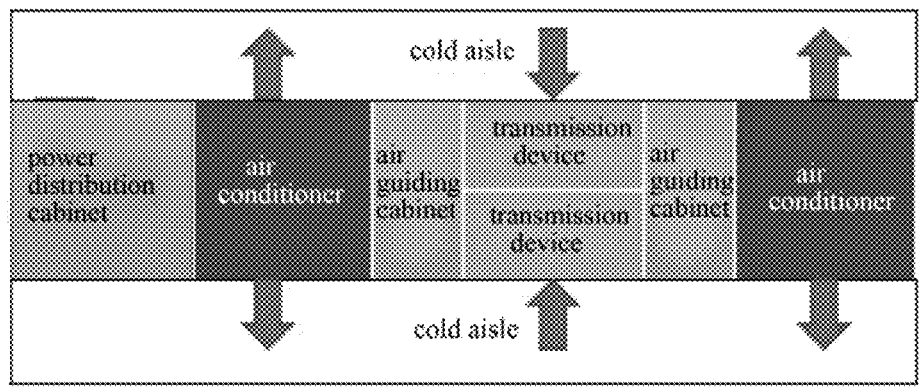
FIG. 2 is a top-view schematic structural diagram of the closed cold pool system shown in FIG. 1.

In this embodiment, as shown in FIG. 1 and FIG. 2, the cabinet assembly 120 includes one main device unit 123 and two in-row air conditioners 122. The main device unit 123 is sandwiched between the two in-row air conditioners 122. The power distribution cabinet 121 is provided on one side of any one of the in-row air conditioners 122 away from the main device unit 123. The main device unit 123 may be provided with a cabinet position at which one transmission device 1231 having a depth of 600 mm or two transmission devices 1231 having a depth of 300 mm (as shown in FIG. 1, the cabinets are placed back to back) may be mounted. The air duct form may be compatible with a form of front-rear air-inlet and top air-outlet, or a form of front-rear air-inlet and front-rear-top air-outlet. With respect to the transmission device 1231 features front-rear air-inlet and front-rear-top air-outlet, an air guide cabinet 1232 is respectively mounted on left and right sides of the transmission device 1231. The two air guide cabinets 1232 form a pair and cannot be mounted separately. Before the left and right air guide cabinets 1232 are mounted, left and right side plates of the transmission device 1231 need to be dismantled, such that hot air from the front and rear of the transmission device 1231 enters the left and right air guide cabinets 1232 through left and right side walls. The air guide cabinets 1232 function to change a direction of part of the hot air discharged from the transmission device 1231, from front-rear air-outlet to top air-outlet from the air guide cabinets 1232 (as shown in FIG. 1, an air-outlet is formed in an upper part of each of the air guide cabinets 1232). The left and right air guide cabinets 1232 are mounted on a floor or a base, and are connected with a cabinet of the transmission device 1231 in a horizontal direction by a cabinet-combining sheet. The transmission device 1231 and the air guide cabinets 1232 form a set of main device unit 123. The main device unit 123 has cold air inlet areas in front and back directions, and a hot air outlet area on the top, thereby forming a relatively well-defined cold and heat isolation area.

As shown in FIG. 1, the two left and right in-row air conditioners 122 are mounted beside the left and right air guide cabinets 1232, respectively. When the two in-row air conditioners 122 operate normally, they operate at a load of 50%, respectively. If one in-row air conditioner 122 reports a fault or needs to be overhauled, the other in-row air conditioner 122 operates at a load of 100%, thereby still ensuring the normal operation of the devices. In this way, a 1+1 backup of the cooling capacity of the closed cold pool system 100 can be achieved through the two in-row air conditioners 122. A size of each in-row air conditioner 122 is the same as that of the transmission device 1231, i.e., 600 mm wide*600 mm deep*2200 mm high. Compared with the existing in-row air conditioner 122 on the market, which is 1000 mm in depth or 1200 mm in depth, the in-row air conditioner 122 and the main device unit 123 form a cabinet row, without any extra size protrusion, thereby having a higher space occupation rate.

Figure 4:
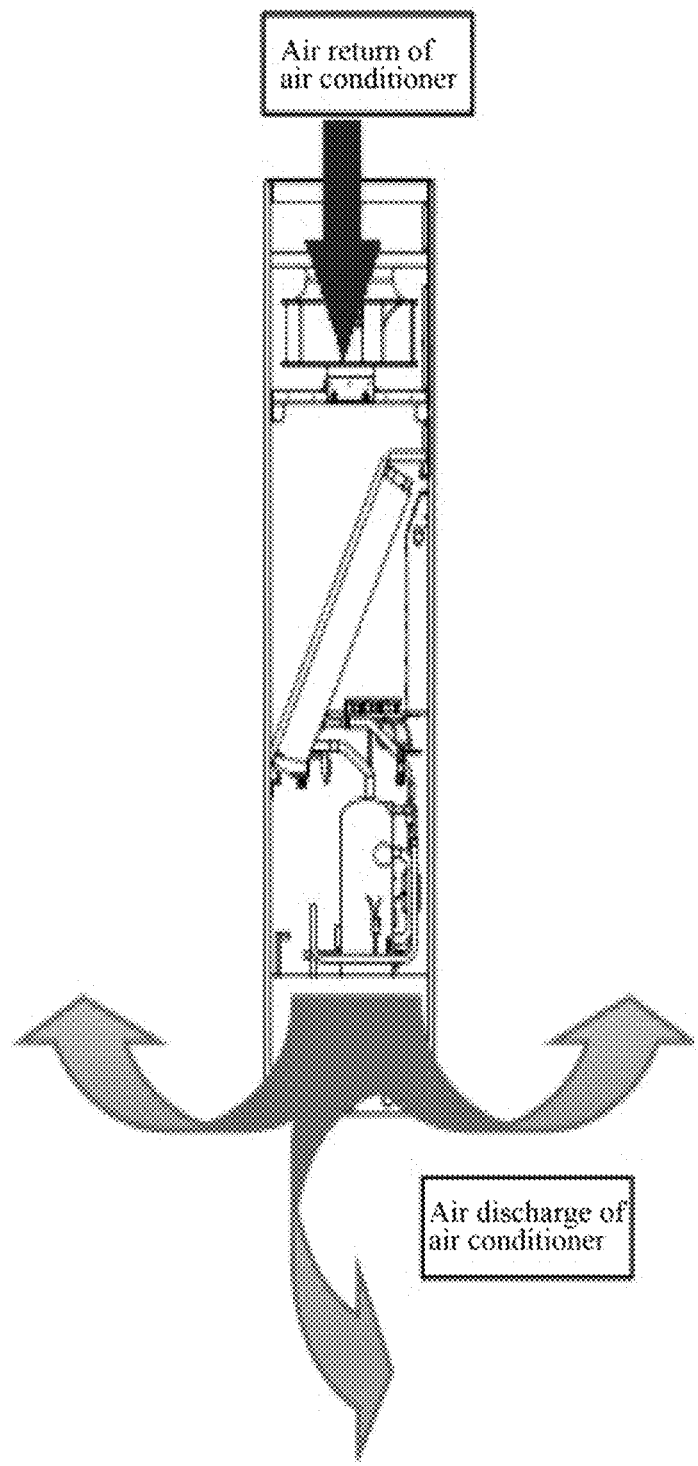
FIG. 4 is a diagram of an air duct form of an in-row air conditioner used in an embodiment of the present disclosure.

As shown in FIG. 1 and FIG. 4, the in-row air conditioners 122 adopt a structure of front-rear air feeding and top air return. In order to realize the air supply control of the in-row air conditioners 122 in different directions of up and down, and left and right, a louver window and a dust-proof net (not shown) are both provided at the front air supply opening 1221 and the rear air supply opening. The louver window includes a first louver blade set and a second louver blade set, where all blades of the first louver blade set are arranged in a longitudinal direction, and all blades of the second louver blade set are arranged in a transverse direction. During operation, the two louver blade sets can realize the air supply control of the in-row air conditioners 122 in different directions of up and down, and left and right by adjusting swing directions of the blades, respectively.

Figure 5:
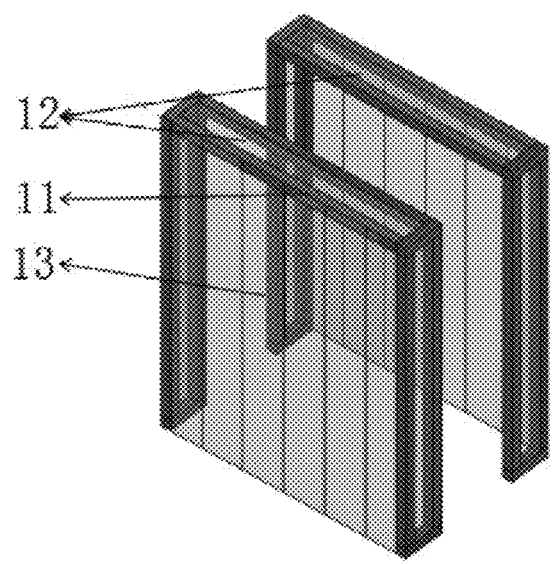
FIG. 5 is a structural diagram of a closing assembly of the closed cold pool system shown in FIG. 1.

As shown in FIG. 1 and FIG. 5, each of the first closing assembly 110 and the second closing assembly 130 includes a closing frame 11 that is joined to the cabinet assembly 120. The bottom end of the closing frame 11 is fastened to the base or a bottom plate, and a joint between the closing frame 11 and the cabinet assembly 120 is fastened by a hinge and self-tapping screws. Side edges of the closing frame 11 are transparent sealing glass so as to realize convenient monitoring of the devices in the cold pool. The closing frame 11 has an inner dimension of 300 mm in depth. A central rotating shaft (not shown) and a set of skylights 12 arranged along a direction of the cabinet assembly 120 are provided on the top of the closing frame 11, the skylights 12 being connected to the central rotating shaft in a rolling-over manner. When the skylights 12 are closed, the skylights 12 are attracted to the top of the corresponding closing frame 11 by an electromagnetic lock (not shown). When an alarm occurs in the closed cold aisle, the electromagnetic lock is automatically disconnected, and each skylight 12 is rolled over by gravity, so that the closed cold aisle is communicated with the environment of the machine room. A door assembly 13 is provided on one side of the closing frame 11 away from the cabinet assembly 120. The door assembly 13 is a set of sliding doors which are arranged in an extension direction of the cabinet assembly 120. Multiple sets of grooves (not shown) are provided between the sliding doors and the corresponding closing frame 11, and each sliding door is stuck in a corresponding groove so as to move along the groove to a position corresponding to any cabinet in the cabinet assembly 120, thereby providing a sufficient space for the maintenance of devices in different areas in the cabinet assembly 120. In this way, the sliding doors do not occupy any space of the machine room in the opening process while allowing maintenance of the devices. The joint between the closing frame 11 and the cabinet assembly 120 is sealed by a sealing strip, which can ensure the airtightness of the closed cold aisle and prevent cold air in the cold pool from escaping. A temperature sensor and a smoke sensor (not shown) are mounted between the top of the closing frame 11 and the corresponding skylights 12, so as to send out an alarm signal in time when there is an abnormal temperature inside the closed cold pool system 100 and a fire or smoke occurs. Meanwhile, a pressure sensor (not shown) is mounted at the end of each groove, and if the sliding door is not closed in place, the pressure sensor can send out an alarm signal.

Figure 3:
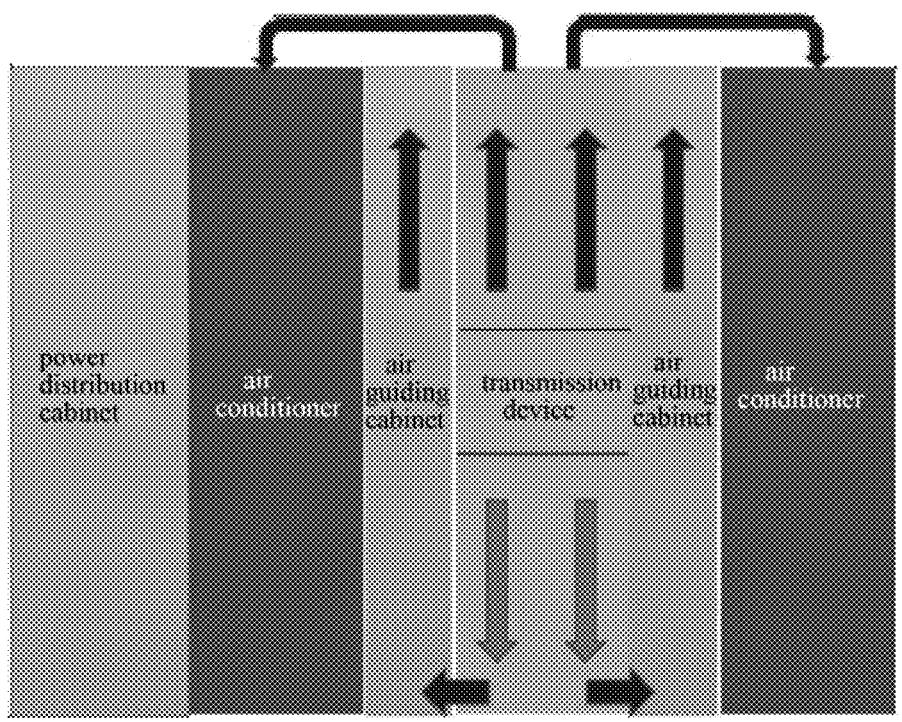
FIG. 3 is a front-view schematic structural diagram of the closed cold pool system shown in FIG. 1.

As shown in FIG. 2 and FIG. 3, the air flow direction of the closed cold pool system 100 during normal operation is as follows: cold air is conveyed to the cold aisles at the front and rear of the device by the in-row air conditioners 122; after the cold air enters the main device unit 123, hot air is discharged into the external environment at the top of the micro-cold pool system 100 by the transmission device 1231 itself and the air guide cabinets 1232 on both sides; the hot air enters an air return opening of each in-row air conditioner 122 and is cooled by a coil, and is then conveyed to the front and rear cold aisles via the front and rear air supply openings, thereby forming a complete air circulation.

Example Embodiment Two

Figure 6:
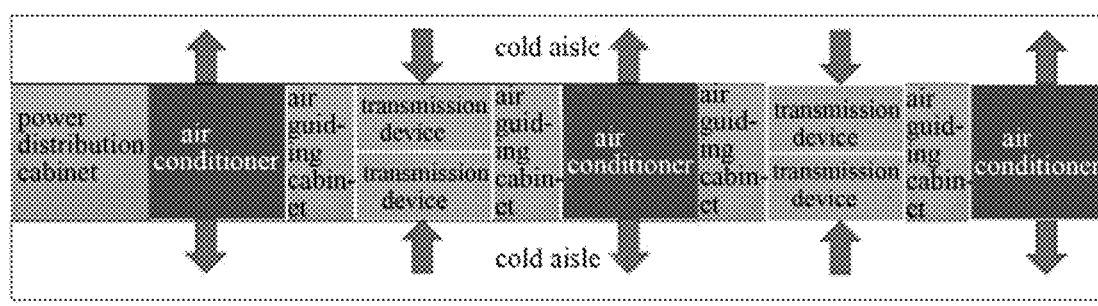
FIG. 6 is a top-view schematic structural diagram of a closed cold pool system provided by Example Embodiment two of the present disclosure.

As shown in FIG. 6, Example Embodiment two of the present disclosure provides a closed cold pool system 100 which differs from the closed cold pool system 100 in Example Embodiment one in the following aspects. The cabinet assembly 120 includes a power distribution cabinet 121 and a main cabinet set. The main cabinet set includes two main device units 123 and three in-row air conditioners 122. One main device unit 123 is provided between every two of the in-row air conditioners 122. The power distribution cabinet 121 is provided at any end of the main cabinet set. An air flow direction during normal operation of this closed cold pool system 100 is basically the same as the air flow direction of the closed cold pool system 100 in Example Embodiment one.

It can be seen that this closed cold pool can perform cold pool closing on a plurality of main device units 123 according to the actual configuration requirements of the machine room. In this case, the cabinet assembly 120 includes a main cabinet set and a power distribution cabinet 121. The main cabinet set includes a plurality of the main device units 123 and a plurality of in-row air conditioners 122. The plurality of in-row air conditioners 122 are arranged sequentially at intervals with one main device unit 123 sandwiched between every two in-row air conditioners 122. The power distribution cabinet 121 is provided at any end of the main cabinet set.

At this time, side plates of the micro-cold pool system are detachable movable plates. When the devices need to be expanded, the side plates of the frame of the micro-cold pool can be dismantled to allow the devices to be directly mounted on the left and right sides, and the closing frame 11 of the micro-cold pool can be directly extended to the left and right sides.

The closed cold pool system 100 provided by the embodiment of the present disclosure is of a micro-cold pool structure with front and back sides being closed, which is formed by a cabinet containing one or more transmission devices 1231, in-row air conditioners 122, air guide cabinets 1232, and closed assemblies on the front and rear sides of the devices. An air duct form of transmission devices 1231 is changed to a form of front-rear air-inlet and top air-outlet by the air guide cabinets 1232 mounted on the left and right sides of the transmission devices 1231. Meanwhile, cold air is conveyed to the cold aisles on the front and rear sides of the devices by using the in-row air conditioners 122 with a customized conveying form in which air returns from the top and is fed from front and rear sides. After the cold air enters the main device unit 123, hot air is discharged into the external environment at the top of the micro-cold pool by the devices themselves and the air guide cabinets 1232 on both sides. The hot air enters the air return opening of each air conditioner and is cooled by a coil, and is then conveyed to the front and rear cold aisles via the front and rear air supply openings, thereby forming a complete air circulation. It can be seen that this closed cold pool system 100 implements cold pool closing of the transmission devices 1231 having complex air ducts, solves the problem of heat dissipation of high-power-consumption transmission devices 1231, and meanwhile achieves the decoupling of the heat dissipation of the transmission devices 1231 from the overall environment of the machine room, such that the impact of the high-power-consumption transmission devices 1231 on the overall environment of the machine room are minimized, thereby improving the local refrigeration efficiency of the machine room, and reducing the maintenance cost of the machine room.

The embodiments of the present disclosure have been described in detail above with reference to the accompanying drawings, but the present disclosure is not limited to the described embodiments. For those having ordinary skill in the art, various changes, modifications, substitutions and modifications made to these embodiments, without departing from the scope as defined in the appended claims, still fall within the protection scope of the present disclosure.

In the description of the present disclosure, it should be understood that, terms such as "central", "longitudinal", "lateral", "length", "width", "thickness", "upper", "lower", "front", "rear", "left", "right", "vertical", "horizontal", "top", "bottom", "inner", "outer", "clockwise", "counterclockwise", "axial", "radial", "peripheral", "row" and "column" should be construed to refer to the orientation as described or as shown in the drawings under discussion. These relative terms are for convenience of description and do not require that the present disclosure be constructed or operated in a particular orientation, and therefore cannot be construed to limit the present disclosure.

In addition, terms such as "first" and "second" are used herein for purposes of description and are not intended to indicate or imply relative importance or significance or to imply the number of indicated technical features. Thus, the feature defined with "first" and "second" may explicitly or implicitly includes one or more of the features. In the description of the present disclosure, "a plurality of" means two or more than two, unless specified otherwise.

In the present disclosure, unless specified or limited otherwise, the terms "mounted", "connected", "coupled", "fixed" and the like are used broadly, and may be, for example, fixed connections, detachable connections, or integral connections; may also be mechanical connections, or electric connections; may also be direct connections, or indirect connections via intervening structures; may also be inner communications or interaction of two elements. The specific meaning of the above terms within the present disclosure may be understood by those having ordinary skill in the art according to particular circumstances.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on", "above" or "on top of" a second feature may include an embodiment in which the first feature is right or obliquely "on", "above" or "on top of" the second feature, or just means that the first feature is at a height higher than that of the second feature; while a first feature "below", "under" or "on bottom of" a second feature may include an embodiment in which the first feature is right or obliquely "below", "under" or "on bottom of" the second feature, or just means that the first feature is at a height lower than that of the second feature.

The invention claimed is:

1. A closed cold pool system, comprising:
a first closing assembly;
a cabinet assembly; and
a second closing assembly,
wherein the first closing assembly is provided on a front side of the cabinet assembly, such that a first closed cold aisle is formed on the front side of the cabinet assembly; wherein the second closing assembly is provided on a rear side of the cabinet assembly, such that a second closed cold aisle is formed on the rear side of the cabinet assembly; wherein the cabinet assembly comprises a power distribution cabinet, an in-row air conditioner and a main device unit that are provided side by side; wherein the in-row air conditioner comprises a front air supply opening, a rear air supply opening and a top air return opening, the front air supply opening is communicated with the first closed cold aisle, and the rear air supply opening is communicated with the second closed cold aisle; and wherein the main device unit is of a front-rear air-inlet and top air-outlet structure formed by a plurality of transmission devices and a plurality of combined air guiding cabinets on two sides of the plurality of transmission devices.

2. The closed cold pool system of claim 1, wherein the cabinet assembly comprises one main device unit and two in-row air conditioners, the main device unit being sandwiched between the two in-row air conditioners, and the power distribution cabinet being provided on one side of any one of the in-row air conditioners away from the main device unit.

3. The closed cold pool system of claim 1, wherein the cabinet assembly comprises a main cabinet set and the power distribution cabinet, the main cabinet set comprises a plurality of the main device units and a plurality of in-row air conditioners, the plurality of in-row air conditioners are arranged sequentially at intervals with one main device unit sandwiched between every two in-row air conditioners, and the power distribution cabinet is provided at any end of the main cabinet set.

4. The closed cold pool system of claim 1, wherein a louver window and a dust-proof net are both provided at the front air supply opening and the rear air supply opening, and the louver window comprises a first louver blade set and a second louver blade set, all blades of the first louver blade set are arranged in a longitudinal direction, and all blades of the second louver blade set are arranged in a transverse direction.

5. The closed cold pool system of claim 1, wherein each of the first closing assembly and the second closing assembly comprises a closing frame that is joined to the cabinet assembly, a bottom end of the closing frame is fastened on a base or a bottom plate, and a joint between the closing frame and the corresponding cabinet assembly is fastened by a hinge and self-tapping screws.

6. The closed cold pool system of claim 1, wherein a central rotating shaft and a set of skylights arranged along a direction of the cabinet assembly are provided on the top of the closing frame, the set of skylights being connected to the central rotating shaft in a rolling-over manner, in response to the set of skylights being closed, the set of skylights are attracted to the top of the closing frame by an electromagnetic lock, and in response to an alarm occurring in the closed cold aisle, the electromagnetic lock is automatically disconnected, and each of the set of skylights is rolled over by gravity, so that the closed cold aisle is communicated with the environment of a machine room.

7. The closed cold pool system of claim 1, wherein a door assembly is provided on one side of the closing frame away from the cabinet assembly, the door assembly is a set of sliding doors which are arranged in an extension direction of the cabinet assembly, and a plurality of sets of grooves are provided between the sliding doors and the corresponding closing frame, and each of the set of sliding doors is stuck in a corresponding groove so as to move along the groove to a position corresponding to any cabinet in the cabinet assembly, providing a sufficient space for the maintenance of a plurality of devices in different areas in the cabinet assembly.

8. The closed cold pool system of claim 1, wherein the joint between the closing frame and the cabinet assembly is sealed with a sealing strip.

9. The closed cold pool system of claim 6, wherein a temperature sensor and a smoke sensor are mounted between the top of the closing frame and each of the set of skylights.

10. The closed cold pool system of claim 7, wherein a pressure sensor is mounted at an end of each groove, and in response to the sliding door not being closed in place, the pressure sensor can send out an alarm signal.

* * * * *